United States Patent [19]

Sakai

[11] Patent Number: 5,097,286
[45] Date of Patent: Mar. 17, 1992

[54] IMAGE RECORDING METHOD USING PHOTOSENSITIVE SHEET HAVING MICROCAPSULES THEREON

[75] Inventor: Jun Sakai, Nagoya, Japan

[73] Assignee: Brother Kogyo Kabushiki Kaisha, Aichi, Japan

[21] Appl. No.: 676,076

[22] Filed: Mar. 27, 1991

[30] Foreign Application Priority Data

May 16, 1990 [JP] Japan .................................. 2-126233

[51] Int. Cl.$^5$ ................................................ G03B 27/52
[52] U.S. Cl. ..................................... 355/27; 355/326; 355/77
[58] Field of Search ...................... 355/27, 28, 100, 69, 355/106, 326

[56] References Cited

U.S. PATENT DOCUMENTS 4,399,209  8/1983  Sanders et al. ...................... 430/138
4,985,727  1/1991  Sakai et al. .............................. 355/27

Primary Examiner—L. T. Hix
Assistant Examiner—D. Rutledge
Attorney, Agent, or Firm—Oliff & Berridge

[57] ABSTRACT

In an image recording method of the present invention, a photosensitive sheet having a transparent substrate coated on one surface with microcapsules encapsulating a photosensitive material, that undergoes a viscosity change upon irradiation by light, and a chromogenic material is superposed upon a photosensitive member and subjected to light exposure. As a result, a chemical latent image corresponding to an original image is formed on the photosensitive sheet and an electrostatic latent image corresponding to the original image is formed on the photosensitive member. Subsequently, an electrostatically charged developer, which reacts with the chromogenic material, is deposited on the photosensitive sheet at a portion on which the chemical latent image is formed. The photosensitive sheet on which the develper is deposited is then superposed, microcapsule side down, on an optional recording medium and the microcapsules having low viscosity are ruptured and discharge the chromogenic material. As a result, an image is developed on the optional recording medium by the reaction of the discharged chromogenic material with the developer.

19 Claims, 3 Drawing Sheets

IMAGE RECORDING METHOD USING PHOTOSENSITIVE SHEET HAVING MICROCAPSULES THEREON

BACKGROUND OF THE INVENTION

1. Field of the invention

The present invention relates to a method for recording an image by using a photosensitive sheet which comprises a transparent substrate and microcapsules each of which encapsulates therein a photosensitive material having a viscosity which changes upon irradiation and a chromogenic material which develops color by reaction with a developer.

2. Description of Related Art

An image recording apparatus using this type of image recording method is disclosed in U.S. Pat. No. 4,985,727, issued on Jan. 15, 1991 and assigned to the same assignee as that of the present invention. That image recording apparatus uses the image recording method described below. U.S. Pat. No. 4,399,209 discloses in detail the structure of the microcapsules used in the recording method, that explanation being incorporated by reference.

A light source is first turned on to irradiate an original in the image recording apparatus. The light irradiated onto the original is reflected from the surface thereof. The light reflected from the surface of the original is transmitted through a focusing lens to a recording medium, the surface of which carries the microcapsules. The recording medium is thus exposed to the projected light consisting of a focused image of the original.

Each of the microcapsules carried on the surface of the recording medium encapsulates therein a photosensitive material, having a viscosity which changes upon irradiation, and a chromogenic material. Therefore, when the light reflected from the original is projected onto the recording medium to focus an image of the original thereon, a change is produced in the rigidity of the microcapsules in accordance with a change in the viscosity related to the amount of light irradiation. Each of the numerous microcapsules carried on the recording medium changes in its rigidity depending upon the amount of light irradiation to thereby form a chemical latent image corresponding to the image of the original on the recording medium. Subsequently, a photosensitive member is subjected to light exposure of the original image in the same manner as was the recording medium.

The photosensitive member is provided with a conductive substrate having a photoconductive layer containing photoconductive materials laminated thereon. When the light reflected from the original image is irradiated onto the photoconductive layer, charges in the layer change in accordance with the original image to form an electrostatic latent image on the photosensitive member corresponding to the original image. Next, the electrostatic a latent image formed on the photosensitive member is developed as latent image of a developer material. This developer latent image contains a developer material that reacts with the chromogenic material found in the microcapsules on the recording sheet to cause the chromogenic material to color. Thereafter, the recording medium is placed onto the photosensitive member so that the microcapsule latent image is superposed on the developer latent image for transferring the developer latent image onto the recording medium. Finally, the recording medium on which the developer latent image is transferred is superposed on an optional recording medium for developing the image under pressure. When pressure is applied to the superposed recording medium, having a developer latent image overlying the microcapsules, and the optional recording medium, the chromogenic material flows out of ruptured microcapsules and reacts with the developer to develop a color image that is recorded on the optional recording medium.

The above-mentioned image recording method makes it possible to record an image on a non-standard or optional recording medium such as a sheet or cloth which cannot be used in the conventional image recording method using the microcapsules.

However, in the aforesaid image recording method, it is difficult to perfectly superpose the developer latent image developed on the photosensitive member onto the chemical latent image formed on the recording medium, thereby resulting in frequent deviation between the developer image and the chemical image. Accordingly, there arises a problem that a part of the image portion which should be developed is not and a defective portion of the final image recorded on the optional recording medium results.

SUMMARY OF THE INVENTION

It is an object of the present invention to overcome the above-mentioned drawbacks and to provide an image recording method capable of recording a final image having no defects onto an optional recording medium by perfectly superposing a developer latent image on a chemical latent image formed on a photosensitive sheet.

This and other objects of the invention can be accomplished by providing an image recording method, the method comprising a step for superposing a photosensitive sheet carrying, on a substrate having light transparent characteristics, microcapsules which encapsulate therein a photosensitive material, having a viscosity which changes upon irradiation, and a chromogenic material on a photosensitive member having a conductive layer and a photoconductive layer laminated thereon, with the substrate in face to face contact with the photoconductive layer; a step for uniformly charging the surface of the microcapsules, the surface of the substrate and the surface of the photoconductive layer; a step for irradiating light having image information onto the photosensitive sheet at the surface carrying the microcapsules, the photosensitive sheet being superposed upon the photosensitive member, in order to form a chemical latent image corresponding to an original image on the photosensitive sheet as well as to form an electrostatic latent image corresponding to the original image on the photoconductive layer of the photosensitive member; a step for depositing a developer onto at least a portion of the photosensitive sheet on which the chemical latent image is formed, the developer capable of reacting with the chromogenic material of the microcapsules to cause the material to color; and a step of rupturing the microcapsules having a low viscosity after superposing the photosensitive sheet on which the developer is deposited on an optional recording medium to cause the chromogenic material to flow out of the ruptured microcapsules and react with the developer to create a copy image on the optional recording medium.

BRIEF DESCRIPTION OF THE DRAWINGS

The above and other objects, features and advantages of the invention will become more apparent from reading the following description of the preferred embodiment taken in connection with the accompanying drawings in which.

DETAILED DESCRIPTION OF THE PREFERRED EMBODIMENTS

Referring to the accompanying drawings, a preferred embodiment of the invention will be described in detail.

Figure 1:
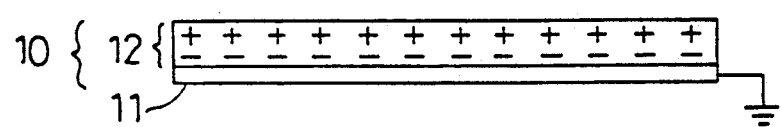
FIG. 1 is a view showing a uniformly charged photoconductive layer of a photosensitive member.

FIG. 1 shows a photosensitive member 10 comprising a conductive layer 11 with a photoconductive material layer 12 laminated thereon. The photoconductive material only exhibits conductive characteristics when irradiated with light. The conductive layer 11 always exhibits conductive characteristics and is grounded. Initially, the upper surface of the photosensitive member 10, i.e., the upper surface of the photoconductive layer 12 is entirely charged to a positive charge by a charger (not shown). As a result, the lower surface of the photoconductive layer 12 is entirely negatively charged by electrostatic induction.

Figure 2:
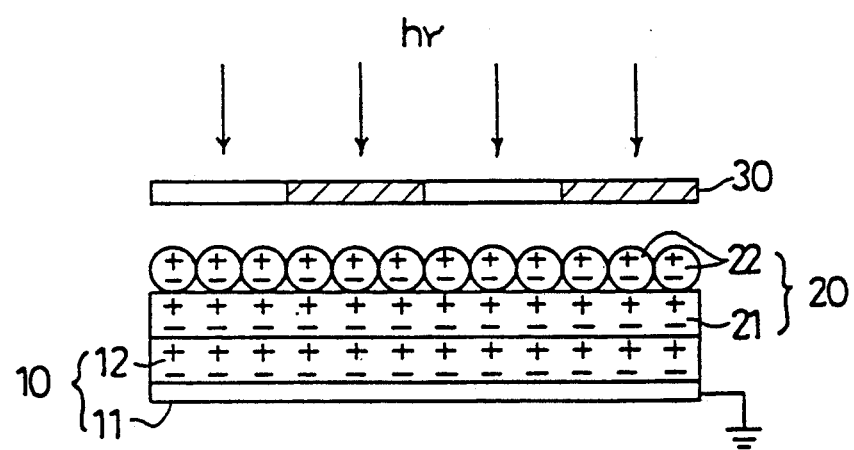
FIG. 2 is a view showing that light is irradiated onto microcapsules through a transparent original after a photosensitive sheet is placed on a photosensitive member.

Next, as shown in FIG. 2, a photosensitive sheet 20 is placed on the positively charged upper surface of photoconductive layer 12. The photosensitive sheet 20 has a light transparent substrate 21 carrying thereon numerous microcapsules 22. The photosensitive sheet 20 is placed on the photosensitive member 10 with the side of the substrate 21 without microcapsules in face to face contact with the photoconductive layer 12.

Each of the microcapsules 22 encapsulates therein a photosensitive material, having a viscosity which changes upon irradiation, and a chromogenic material. Examples of acceptable photosensitive materials are photo-dimerized resins having a cinnamic acid residue or a cinnamylidene residue, photo-decomposed resins having a photosensitive group such as a diazonium salt residue or a quinonediazide residue, and photopolymerized resins having an acryloyl group, aryl group or vinyl group. Examples of acceptable chromogenic materials are triarylmethane compounds such as 3,3-bis(p-dimethylaminophenyl)-6-dimethylaminophthalide, diphenylmethane compounds such as 4,4'-bisdimethylaminobenzhydrinbenzylether, xanthene compounds such as 3-dimethylamino-7-methoxyfluorene, thiazine compounds such as benzoylleucomethylene blue, and spiro compounds such as 3-methyl-spiro-dinaphthopyrane.

When the photosensitive sheet 20 is superposed on the photosensitive member 10, negative charges are generated at the lower surface of the substrate 21 while positive charges appear at the upper surface of the substrate 21. Further, negative charges are generated at the lower surface of the microcapsules carried on the surface of substrate 21 and positive charges appear at their upper surfaces.

The surface of the photosensitive sheet 20, i.e., the upper surface of the microcapsules 22 may be entirely charged to a positive charge by a charger (not shown) after the photosensitive sheet 20 is placed on the photosensitive member 10 if it has not been previously charged to obtain the above-mentioned charge condition of the various sheets and surfaces.

Once the charge conditions are met, a transparent original 30 is placed over the photosensitive sheet 20. The transparent original 30 placed on the photosensitive sheet 20 is irradiated with light h $\nu$. The photosensitive material encapsulated in each of the microcapsules 22 which are irradiated with light h $\nu$, and is sensitive to light h $\nu$, through the transparent original 30 increases in viscosity and in rigidity. On the other hand, the photosensitive material encapsulated in each of the microcapsules 22 to which light h $\nu$ is not irradiated due to the interference of the transparent original 30, remain unchanged in viscosity or is not sensitive to the frequency of the light, and has a low rigidity. In this way, the microcapsules 22 change in rigidity in accordance with the amount of light irradiation, whereby a chemical latent image is formed on the photosensitive sheet 20. The transparent original 30 may be one having an original mounted on a transparent medium or a liquid crystal panel on which an image is displayed. The light h $\nu$ may be the light reflected from the original image or that radiated from the display.

Figure 3:
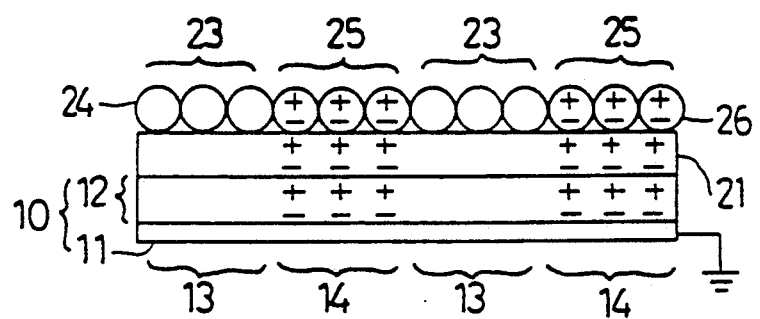
FIG. 3 is a view showing that a portion of a photoconductive layer positioned below the microcapsules irradiated by light becomes conductive, and charges on the exposed portions are dissipated.

FIG. 3 shows that the photoconductive layer beneath the microcapsules which are exposed becomes conductive, thereby dissipating the charges at the exposed areas. The microcapsules 24, shown in FIG. 3, have been exposed and have an increased rigidity and microcapsules 26 have not been exposed and therefore have a low rigidity.

The exposed microcapsules 24 in the exposed areas 23 increase in rigidity, as mentioned above, so that they are unlikely to rupture with the application of pressure from outside.

For the photosensitive member 10 having the photosensitive sheet 20 laminated thereon, the photoconductive layer 12 in the exposed areas 13, those areas 13 irradiated with the light h $\nu$, exhibit conductive characteristics. Therefore, the positive charges accumulated in the photoconductive layer 12 are grounded through the conductive layer 11 resulting in their dissipation. On the other hand, the positive charges on the photosensitive member 10 at the unexposed areas 14, those areas 14 not irradiated with the light h $\nu$, remain thereon since the photoconductive layer 12 in the unexposed areas 14 is not conductive. Accordingly, an electrostatic latent image corresponding to the original image is formed on the photosensitive member 10. In addition, the induced positive charges on the photosensitive sheet 20 are dissipated at the exposed areas 23 and remain at the unexposed areas 25. In this way, an electrostatic latent image is also formed on the photosensitive, sheet 20.

The most important thing is that the chemical latent image formed on the photosensitive sheet 20 and the electrostatic latent image formed on the photosensitive member 10 and the photosensitive sheet 20 are absolutely and identically overlapped with each other.

Figure 4:
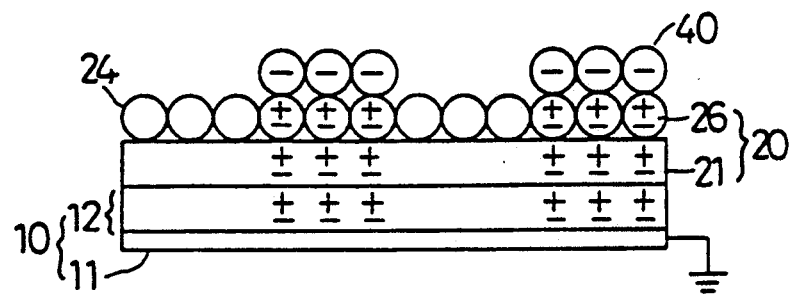
FIG. 4 is a view showing a negatively charged developer deposited onto microcapsules having positive surface charges.

FIG. 4 shows that a developer, which is negatively charged in advance, is deposited onto the microcapsules having positive surface charges, i.e., those that were not exposed. First, the negatively charged developer 40 is supplied to the photosensitive sheet 20 from a developing device (not shown), thereby producing a developer image corresponding to the electrostatic latent image formed on the photosensitive sheet 20. This developer 40 contains a developing material which reacts with the chromogenic material to cause the material to color. Examples of the developing material to be used include inorganic materials such as acid clay, kaolin and zeolite; organic acid materials comprising substituted phenol compounds such as p-crezol and p-octylphenol; phenol resin compounds such as phenol-formalin condensation products and substituted phenol-formalin condensation products; metal salt modified phenol resin compounds modified with a polyvalent metal such as zinc or nickel; aromatic carboxylic acid compounds such as p-butyl benzoic acid, salicylic acid, 3-5-di-tert-butyl salicylate, and 3,5-di(α-methylbenzyl) salicylate; or metal salts of the aromatic carboxylic compounds obtained from a polyvalent metal such as zinc or nickel. In addition, mixtures of aromatic carboxylic compounds and polyvalent metal compounds such as zinc acetate and zinc propionic acid may be used.

As shown in FIG. 4, the chemical latent image formed on the photosensitive sheet 20 and the developer image exactly overlap one another at this stage.

The photosensitive sheet 20, with overlayed developer image is then placed on an optional recording medium, microcapsule side toward the optional recording medium, for rupturing by an application of pressure the microcapsules having low viscosity, that is those that were not irradiated by the light.

Figure 6:
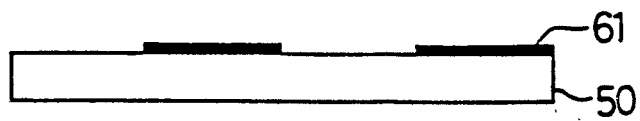
FIG. 6 is a view showing an optional recording medium with an image recorded thereon.

The photosensitive sheet 20 carrying the developer 40 is superposed microcapsule side down on the optional recording medium 50 for effecting development through the application of pressure P to the backside of the photosensitive sheet or, alternatively, to the back of the optional recording medium. The microcapsules 24 which have been exposed, at areas 23, are not ruptured because of their high rigidity as mentioned above. However, the unexposed microcapsules 26, at areas 25, are easily ruptured by the application of pressure, because of their low rigidity, and the materials encapsulated therein are discharged. The chromogenic material contained in the discharged materials comes in contact with the developer 40 and reacts therewith to form a color. Consequently, an image 61 is recorded on the optional recording medium 50 as shown in FIG. 6.

Another embodiment of the present invention will be explained hereinbelow. Each of microcapsules of this second embodiment encapsulates, within an outside wall having heat fusing characteristics, a photosensitive material, having a viscosity which changes upon light irradiation, and a chromogenic material.

Among materials used to produce an outside wall having heat fusing characteristics are, for example, animal waxes such as beeswax, spermaceti, Chinese wax and lanolin; vegetable waxes such as candelilla wax, carnauba wax, Japan wax, rice wax, and sugar cane wax; mineral waxes such as montan wax, ozokerite, ceresin and lignite; oil waxes such as paraffin wax and microcrystalline wax; modified waxes such as montan wax derivatives, paraffin wax derivatives and microcrystalline wax derivatives; hydro-waxes such as caster wax and opal wax; synthetic waxes such as low molecular polyethylene and its derivatives, Acrawax and distearylketone wax; saturated fatty acid amide waxes such as caproic acid amide, caprylic acid amide, pelargonate acid amide, capric acid amide, lauric acid amide, tridecylic acid amide, myristiate acid amide, stearate acid amide, behenic acid amide and ethylene-bisstearate acid amide; and unsaturated fatty acid amide waxes such as caproleinic acid amide, myristoleic acid amide, oleic acid amide, elaidic acid amide, linoleic acid amide, eruic acid amide, ricinoleic acid amide, and linolenic acid amide. These waxes can be used singly or in combination.

Other materials that may be used for the outside wall, besides wax, include gum arabic, starch, polyvinyl acetate, ethylene-vinyl acetate copolymer, polyvinyl alcohol, polyethylene, polystyrene, polyamide, polyester, polyurethane and polyethylene imine. Materials which permit light to be fully transmitted are preferred for the outside wall.

When microcapsules having an outside wall made of a material mentioned above are used, the procedures for placing an image on an optional recording medium 50 are the same as the previously described first embodiment until the photosensitive sheet 20 carrying the developer 40 is superposed microcapsule side down on the optional recording medium 50. That is, what is shown in FIGS. 1-4, and described above with respect thereto is unchanged. However, the procedures described with respect to FIG. 5 and the follow-on actions change.

Figure 5:
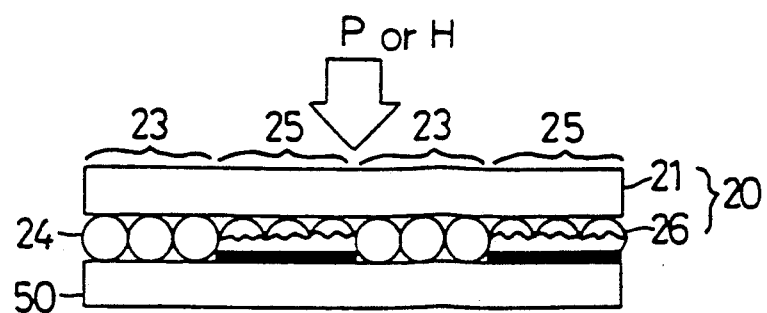
FIG. 5 is a view showing the photosensitive member is superposed on an optional recording medium and pressure or heat applied to rupture the low viscosity microcapsules.

As shown as an alternative process in FIG. 5, the photosensitive sheet 20 carrying the developer 40 is superposed on the optional recording medium 50 for effecting image development by the application of heat H using a heating means (not shown). Each of the exposed microcapsules 24 on the photosensitive sheet 20, in exposed areas 23, has a high rigidity as mentioned above. Thus, the materials encapsulated therein do not flow out even if the outside wall of the microcapsule 24 is fused by heat. However, each of the unexposed microcapsules 26, in unexposed areas 25, has a low rigidity, as mentioned above, and the materials encapsulated therein are released when the outside wall is fused by heat. The chromogenic materials in the discharged materials contact the developer 40 and react therewith, thereby developing color. The resultant developed image 61 is recorded on the optional recording medium 50 as shown in FIG. 6. By using microcapsules having a thermal fusible outside wall, the image recording device can be made compact because it is not necessary to have a large pressure means. This, in turn, reduces manufacturing costs.

It should be noted that the present invention is not limited to the above description, but is subject to various changes and modifications without departing from the spirit and scope of the invention.

For example, the photosensitive member and the photosensitive sheet may be charged after the photosensitive sheet has been superposed on the photosensitive member rather than placing the photosensitive sheet on the photosensitive member after the photosensitive member is charged as described for the first step of the process.

Other changes encompassed as within the scope and spirit of the invention include depositing the developer entirely on the microcapsules and not necessarily grounding from the beginning of the procedures. The conductive layer 11 may be grounded at a later time so long as it is grounded before the light having image information is irradiated.

As apparent from the above-mentioned description, the present invention makes it possible to absolutely and identically superpose a developer latent image on the chemical latent image formed on the photosensitive sheet, in an industrially effective manner, so that an image having high quality can be recorded on an optional recording medium without any loss from the original image.

What is claimed is:

1. An image recording method for recording on a non-standard recording medium comprising the steps of:
    superposing a photosensitive sheet having a transparent substrate with microcapsules coated on a first surface of said substrate on a photosensitive member having a conductive layer and a photoconductive layer on the conductive layer to place an uncoated second surface of said substrate in contact with the photoconductive layer of the photosensitive member, each of said microcapsules encapsulating a photosensitive material and a chromogenic material, said photosensitive material changing viscosity to increase hardness upon irradiation by light;
    uniformly charging surfaces of the microcapsules, the substrate and the photoconductive layer;
    irradiating light having image information of an original image toward the surface of the microcapsules to form a chemical latent image defined by unexposed microcapsules corresponding to the original image on the photosensitive sheet and through the substrate to form an electric latent image corresponding to the original image on the photoconductive layer of the photosensitive member;
    providing a developer onto at least a portion of the photosensitive sheet on which the chemical latent image is formed;
    superposing the photosensitive sheet on which the developer is provided upon a recording medium; and
    rupturing the unexposed microcapsules whereby the chromogenic material flows out of each of the ruptured microcapsules to react with the developer to produce a copy of the original image on the recording medium.

2. An image recording method as claimed in claim 1, wherein the charging step is completed by superposing the photosensitive sheet upon the photosensitive member after the surface of the photoconductive layer of the photosensitive member has been charged to uniformly charge the photosensitive member, the substrate and the microcapsules.

3. An image recording method as claimed in claim 1, wherein the charging step is completed by uniformly charging the surface of the microcapsules after the photoconductive layer is placed in face to face contact with the substrate.

4. An image recording method as claimed in claim 1, further comprising the step of charging the developer to a polarity opposite to that of the upper surface of the microcapsules at the area where a chemical latent image is formed prior to providing the developer.

5. An image recording method as claimed in claim 1, wherein the microcapsules are ruptured by an application of pressure.

6. An image recording method as claimed in claim 1, wherein each of the microcapsules comprises a thermally fusible outside wall encapsulating the photosensitive and chromogenic materials.

7. An image recording method as claimed in claim 6, wherein the microcapsules are ruptured by an application of heat.

8. An image recording method as claimed in claim 1, wherein the conductive layer is grounded prior to the photosensitive sheet being superposed on the photosensitive member and irradiated with light having image information.

9. An image recording sheet capable of recording an image on an optional recording medium, comprising:
    a photosensitive sheet carrying electrostatically charged microcapsules on a first surface, each microcapsule encapsulating therein a photosensitive material having a viscosity which changes upon exposure to irradiated light to become rigid and a chromogenic material, the irradiated light carrying image information and discharging the microcapsules at exposed areas; and an electrostatically charged developer having a polarity opposite to that of the charged microcapsules thereby overlying the unexposed areas.

10. An image recording sheet as claimed in claim 9, wherein said chromogenic material and said developer when brought into contact react to produce a colored dye.

11. An image recording sheet as claimed in claim 10, said microcapsules further comprising a pressure sensitive outer wall.

12. An image recording sheet as claimed in claim 11, said microcapsules further comprising a thermally sensitive outer wall.

13. An image recording method for recording a non-standard recording medium comprising the steps of:
    grounding a conductive layer of a photosensitive member having the conductive layer with a photoconductive layer on the conductive layer;
    superposing a photosensitive sheet having a transparent substrate with microcapsules coated on a first surface of said substrate on a photosensitive member having said grounded conductive layer to place an uncoated second surface of said substrate in contact with the photoconductive layer of the photosensitive member, each of said micro-capsules encapsulating a photosensitive material and a chromogenic material, such photosensitive material changing viscosity to increase hardness upon irradiation by light;
    uniformly charging surfaces of the micro-capsules, the substrate and the photoconductive layer;
    irradiating light having image information of an original image toward the surface of the microcapsules to form a chemical latent image defined by unexposed microcapsules corresponding to the original image on the photosensitive sheet and through the substrate to form an electric latent image corresponding to the original image on the photoconductive layer of the photosensitive member;

providing a developer onto at least a portion of the photosensitive sheet on which the chemical latent image is formed;

superposing the photosensitive sheet on which the developer is provided upon a recording medium; and rupturing the unexposed microcapsules whereby the chromogenic material flows out of each of the ruptured microcapsules to react with the developer to produce a copy of the original image on the recording medium.

14. An image recording method as claimed in claim 13, wherein the charging step is completed by superposing the photosensitive sheet upon the photosensitive member after the surface of the photoconductive layer of the photosensitive member has been charged to uniformly charge the photosensitive member, the substrate and the microcapsules.

15. An image recording method as claimed in claim 13, wherein the charging step is completed by uniformly charging the surface of the microcapsules after the photoconductive layer is placed in face to face contact with the substrate.

16. An image recording method as claimed in claim 13, further comprising the step of charging the developer to a polarity opposite to that of the upper surface of the microcapsules at the area where a chemical latent image is formed prior to providing the developer.

17. An image recording method as claimed in claim 13, wherein the microcapsules are ruptured by an application of pressure.

18. An image recording method as claimed in claim 13, wherein each of the microcapsules comprises a thermally fusible outside wall encapsulating the photosensitive and chromogenic materials.

19. An image recording method as claimed in claim 18, wherein the microcapsules are ruptured by an application of heat.

* * * * *